United States Patent
Jiang

(10) Patent No.: US 11,060,713 B2
(45) Date of Patent: Jul. 13, 2021

(54) INTERNAL-CIRCULATING HEAT DISSIPATION SYSTEM FOR STAGE LIGHT

(71) Applicant: Guangzhou Haoyang Electronic Co., Ltd., Guangdong (CN)

(72) Inventor: Weikai Jiang, Guangdong (CN)

(73) Assignee: Guangzhou Haoyang Electronic Co., Ltd.

( * ) Notice: Subject to any disclaimer, the term of this patent is extended or adjusted under 35 U.S.C. 154(b) by 0 days.

(21) Appl. No.: 16/738,503

(22) Filed: Jan. 9, 2020

(65) Prior Publication Data
US 2021/0131657 A1    May 6, 2021

Related U.S. Application Data

(63) Continuation of application No. PCT/CN2019/127187, filed on Dec. 20, 2019.

(30) Foreign Application Priority Data

Oct. 31, 2019  (CN) .......................... 201911055313.6

(51) Int. Cl.
*F21V 29/71*    (2015.01)
*F21V 21/15*    (2006.01)
*H05K 7/20*    (2006.01)

(52) U.S. Cl.
CPC .............. *F21V 29/71* (2015.01); *F21V 21/15* (2013.01); *H05K 7/20263* (2013.01)

(58) Field of Classification Search
CPC ..... F21V 29/71; F21V 21/15; H05K 7/20263; F21W 2131/406
See application file for complete search history.

(56) References Cited

U.S. PATENT DOCUMENTS 4,701,833 A     10/1987  Bornhorst
10,174,924 B1 * 1/2019  Mart ................... F21V 29/2212
(Continued)

FOREIGN PATENT DOCUMENTS

CN    205938754 U    2/2017
CN    206592895 U    10/2017
(Continued)

OTHER PUBLICATIONS

Extended European Search Report with Written Opinion for Application No. 19220113.5 dated Jun. 18, 2020, 6 pages.
(Continued)

*Primary Examiner* — Leah Simone Macchiarolo
(74) *Attorney, Agent, or Firm* — Lerner, David, Littenberg, Krumholz & Mentlik, LLP

(57) ABSTRACT

The present invention discloses an internal-circulating heat dissipation system for a stage light, the system comprising a support arm, a light holder and a circulating heat dissipation system, wherein the light holder is pivotally connected to the support arm through a pivot shaft, the pivot shaft is of a shaft pipe structure, an internal space of the light holder is in communication with an internal space of the support arm through the pivot shaft, the circulating heat dissipation system comprises a cooling medium, a heat dissipation component located inside the support arm, and a power component that promotes the cooling medium to flow in circulation between the light holder and the heat dissipation component through the shaft pipe structure, and the cooling medium is isolated from an external space of the stage light.

7 Claims, 5 Drawing Sheets

(56) References Cited

U.S. PATENT DOCUMENTS

| | | | |
|---|---|---|---|
| 2005/0036316 A1* | 2/2005 | De Sisti | F21V 23/026 362/264 |
| 2013/0094193 A1 | 4/2013 | Baxter et al. | |
| 2014/0119019 A1 | 5/2014 | Hsu | |
| 2019/0049103 A1* | 2/2019 | Jiang | F21V 29/83 |
| 2019/0390840 A1* | 12/2019 | Kopeckova | F21V 21/15 |
| 2020/0173725 A1* | 6/2020 | Jiang | F28D 1/0408 |

FOREIGN PATENT DOCUMENTS

| | | |
|---|---|---|
| CN | 109185750 A | 1/2019 |
| CN | 109737336 A | 5/2019 |
| CN | 209355061 U | 9/2019 |
| CN | 210831580 U | 6/2020 |
| FR | 3034173 B1 | 4/2018 |
| WO | WO-2011098858 A1 * 8/2011 ................ F21S 8/00 |

OTHER PUBLICATIONS

International Search Report for Application No. PCT/CN2019/127187 dated Aug. 5, 2020, 3 pages.

* cited by examiner

INTERNAL-CIRCULATING HEAT DISSIPATION SYSTEM FOR STAGE LIGHT

CROSS REFERENCE TO RELATED APPLICATIONS

The present application is a continuation of International Application No. PCT/CN2019/127187, filed Dec. 20, 2019, which claims priority from Chinese Patent Application No. 201911055313.6 filed Oct. 31, 2019, all of which are hereby incorporated herein by reference.

TECHNICAL FIELD

The present invention relates to the technical field of stage lights, and more particular to an internal-circulating heat dissipation system for a stage light.

BACKGROUND ART

The current stage lights have more and more functions, and the structure thereof is also more and more sophisticated, so it is necessary to prevent dust or liquid from entering the light body to damage internal elements. However, since the stage light generally has very high power, it usually needs rapid ventilation and heat dissipation, and especially for a light holder of the stage light which generates the most heat, it most needs to be waterproof and dustproof. At present, for most of the stage lights, rapid heat dissipation is achieved through air convection inside and outside the light holder. For stage lights with high requirements for waterproof performance, the heat in the light holder is usually dispersed and guided to a shell of the light holder so as to perform the heat dissipation through the heat exchange between the shell and the outside, which is low in efficiency.

SUMMARY

In order to overcome at least one of the deficiencies described above in the prior art, the present invention provides an internal-circulating heat dissipation system for a stage light, such that the heat inside a light holder of a stage light is dispersed and guided into a support arm so as to dissipate heat by means of the support arm, thereby enlarging the heat dissipation space and improving the heat dissipation efficiency while ensuring the leak tightness of the light holder.

In order to solve the above technical problem, a technical solution used in the present invention is as follows: an internal-circulating heat dissipation system for a stage light, the system comprising a support arm, a light holder and a circulating heat dissipation system, wherein the light holder is pivotally connected to the support arm through a pivot shaft, the pivot shaft is of a shaft pipe structure, an internal space of the light holder is in communication with an internal space of the support arm through the pivot shaft, the circulating heat dissipation system comprises a cooling medium, a heat dissipation component located inside the support arm, and a power component that promotes the cooling medium to flow in circulation between the light holder and the heat dissipation component through the shaft pipe structure, and the cooling medium is isolated from an external space of the stage light.

According to the internal-circulating heat dissipation system for a stage light, the cooling medium is driven by the power component to flow in circulation between the light holder and the support arm through the pivot shaft of a shaft pipe structure, so that the heat inside the light holder is brought out, and heat dissipation is performed by the heat dissipation component at the support arm, thereby enlarging the heat dissipation space and improving the heat dissipation efficiency while ensuring the leak tightness of the light holder. Moreover, since the heat dissipation component is arranged inside the support arm, the volume of the light holder is effectively reduced as compared with the previous case in which the heat dissipation component is arranged inside the light holder, which facilitates the miniaturization of the stage light.

Further, the light holder is pivotally connected to the support arm through two pivot shafts, both the pivot shafts are of a shaft pipe structure, and the cooling medium flows into one of the shaft pipe structures and flows out of the other shaft pipe structure. As such, a circulation loop is formed, the heat dissipation channel is longer, and the cooling medium is cooled more thoroughly.

Further, the cooling medium flows into and out of the light holder through the same pivot shaft. When the light holder is pivotally connected to the support arm only through one pivot shaft, such a method can be used; or else the light holder is pivotally connected to the support arm through the two pivot shafts, the cooling medium flows into and out of the light holder through the same pivot shaft, and one of the pivot shafts can be reserved for a signal line or an electric wire passing therethrough.

Further, a connecting pipe is provided inside the pivot shaft, the connecting pipe comprises an inner pipe and an outer pipe, the cooling medium flows between the light holder and the support arm through the inner pipe and an interlayer between the inner pipe and the outer pipe, and a rotary seal is provided on the inner pipe and/or the outer pipe. As such, it is achieved that the cooling medium flows into and out of the light holder through the same pivot shaft.

Further, the light holder is pivotally connected to the support arm through two pivot shafts, both the pivot shafts are of a shaft pipe structure, and the cooling medium is divided into two flows, each of which flows in circulation between the light holder and one of the heat dissipation components through one of the pivot shafts. The two flows of cooling medium are used for heat dissipation, which is higher in heat dissipation efficiency.

Optionally, the two flows of cooling medium are mixed in the light holder and then respectively flow out through one of the pivot shafts.

Further, the heat dissipation component comprises a heat dissipation fin, a flow guide pipe passing through the heat dissipation fin and used for guiding flow of the cooling medium, and a heat dissipation fan for heat dissipation of the heat dissipation fin; and the support arm is provided with a ventilation opening corresponding to the heat dissipation fan. The cooling medium flows through the flow guide pipe in which heat is trapped by the heat dissipating fin, then heat dissipation is performed for the flow guide pipe and the heat dissipating fin by the heat dissipation fan, and the heat is led out of the stage light through the ventilation opening, thereby realizing rapid heat dissipation for the stage light.

Further, the cooling medium is gas. When the gas flow between the light holder and the support arm, the requirement of leak tightness is low, so that even if accidental leakage occurs, it will not cause any damage to the elements in the stage light.

Further, further comprising a light source and a heat insulation cavity provided to enclose the light source, the heat insulation cavity is in communication with a heat medium inlet of the heat dissipation component, and the power component further comprises at least one blowing mechanism that blows the cooling medium from a cooling medium outlet of the heat dissipation component into the heat insulation cavity. With the heat insulation cavity, all the heat is guided to the heat dissipation component, which can prevent the heat of the light source from being dissipated into the light holder to cause damage to other elements in the light holder.

Further, further comprising a flow dividing cavity, wherein the flow dividing cavity has a first sealing chamber and a second sealing chamber, the power component comprises at least one air extraction mechanism, a cooling medium outlet of the heat dissipation component is in communication with the first sealing chamber, the first sealing chamber is further provided with an air extraction opening, the air extraction opening is provided with the air extraction mechanism, and the heat insulation cavity is in communication with a hot gas flow inlet of the heat dissipation component through the second sealing chamber. With the flow dividing cavity, the low-temperature cooling medium is isolated from the high-temperature cooling medium, and the low-temperature cooling medium is drawn off by the air extraction mechanism through the air extraction opening and fills up the whole interior of the light holder so as to perform heat dissipation for other elements inside the light holder, and is then blown into the heat insulation cavity by the blowing mechanism so as to perform heat dissipation for the light source, thereby realizing heat dissipation for the whole light holder.

Further, the light holder is provided, on both sides, with a side plate that is pivotally connected to the support arm; and a cold air channel, through which the cooling medium outlet is connected to the first sealing chamber, is at least partially formed by a cover plate being fastened to the side plate, and/or a hot air channel, through which the heat medium inlet is connected to the second sealing chamber, is at least partially formed by a cover plate being fastened to the side plate. By means of the cover plate being directly fastened to the side plate to form the cold air channel and/or the hot air channel, it only needs to use a cover plate made of a panel, which is convenient for processing, and makes full use of the side plate of the support arm without the need of mounting an additional air duct so as to avoid the problem of aging of the air duct.

DETAILED DESCRIPTION OF EMBODIMENTS

The accompanying drawings are merely for exemplary illustration and are not to be construed as limiting the present invention. For better illustration of the embodiments, some components in the figures may be omitted, scaled up or scaled down, which does not represent the actual size of a product. For those skilled in the art, it would have been appreciated that some well-known structures in the figures and the illustration thereof could be omitted. The position relationship described in the figures are merely for exemplary illustration and are not to be construed as limiting the present invention.

Figure 1:
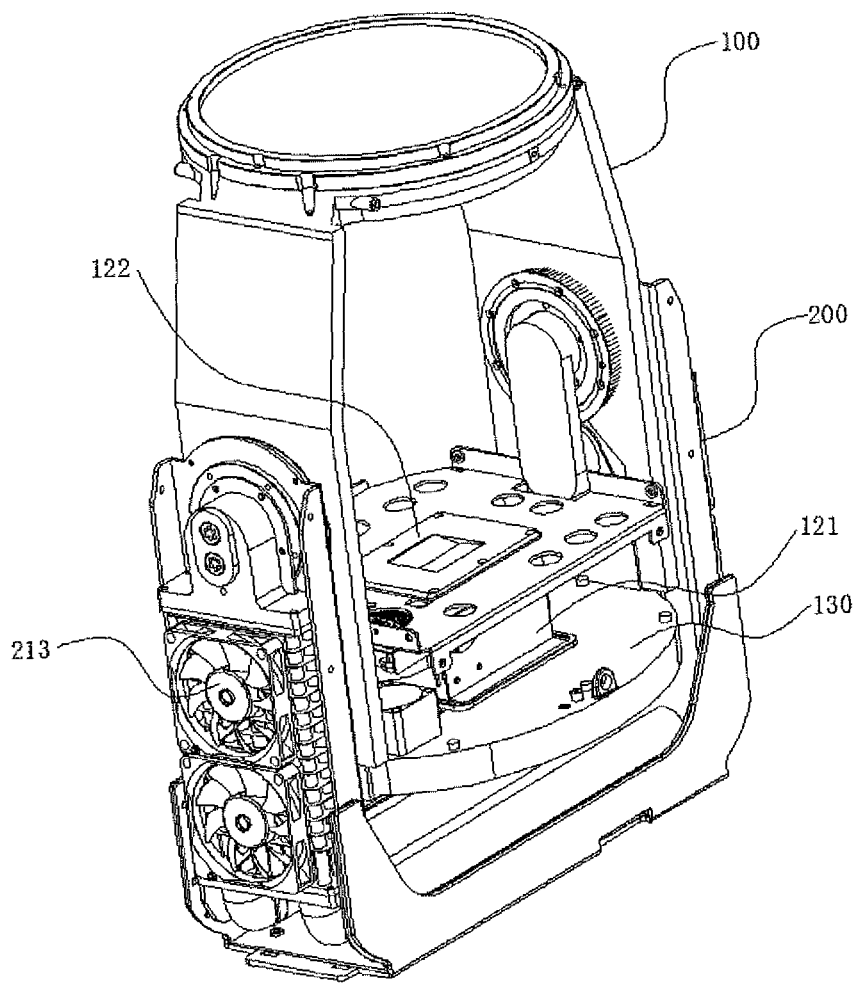
FIG. 1 is an overall structural schematic diagram of an internal-circulating heat dissipation system for a stage light of embodiment I of the present invention.
Figure 2:
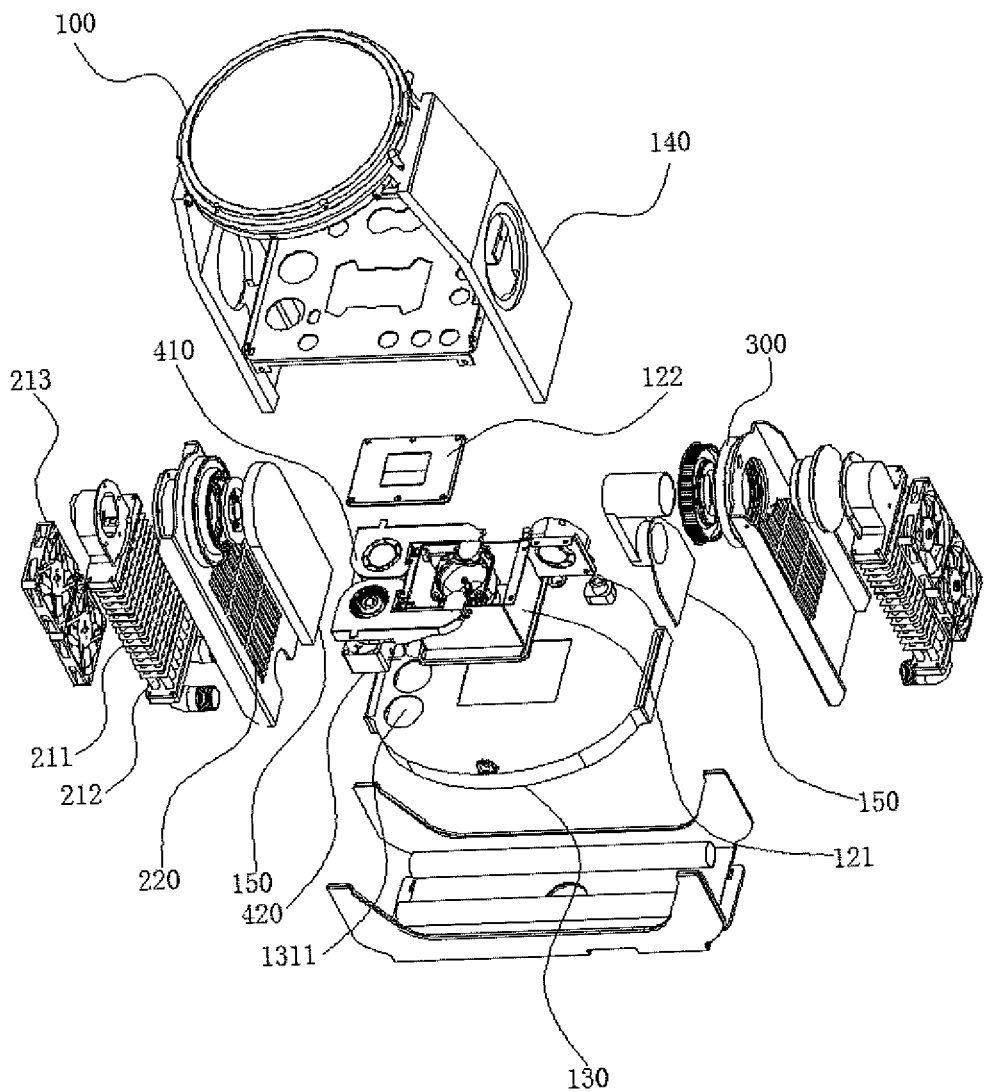
FIG. 2 is an exploded structural schematic diagram of the internal-circulating heat dissipation system for a stage light of embodiment I of the present invention.
Figure 3:
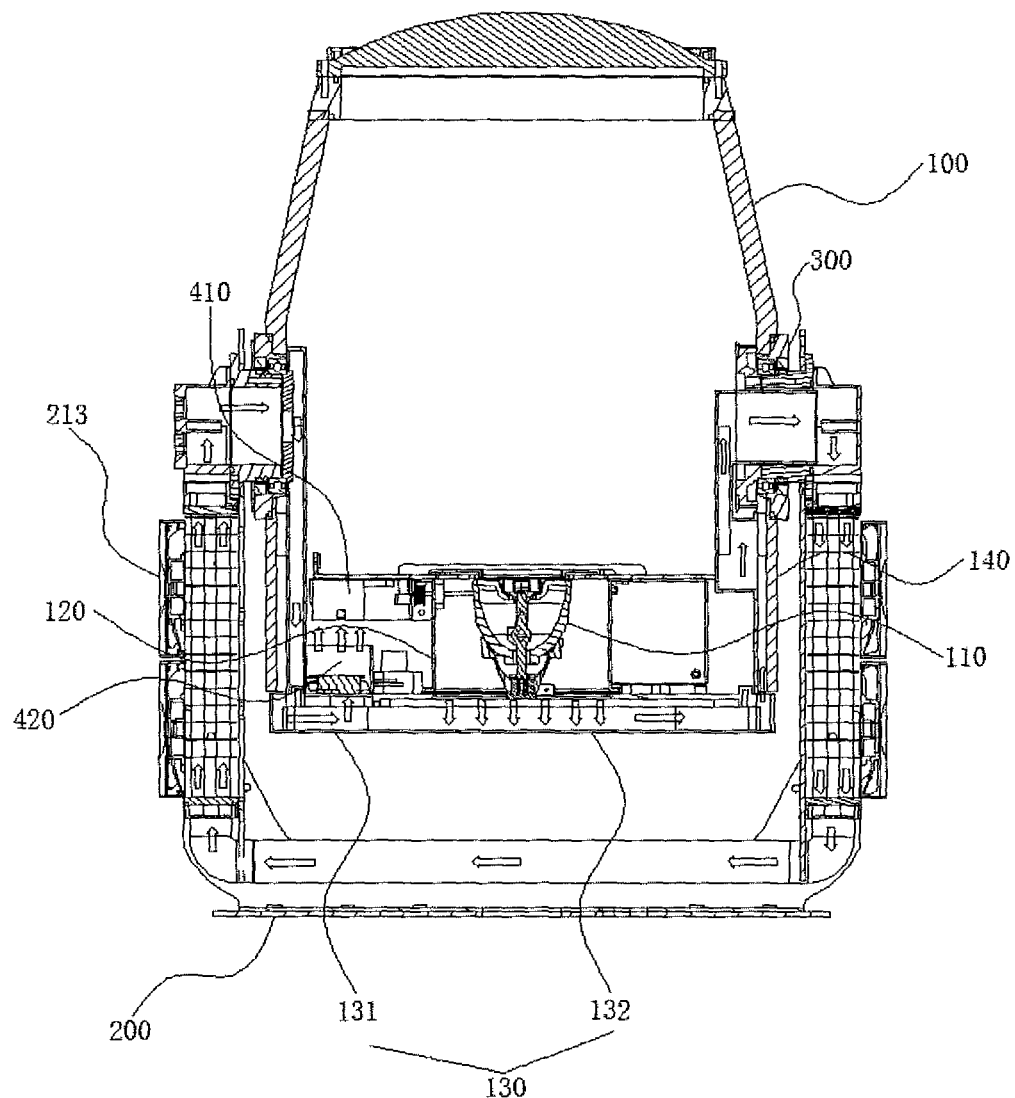
FIG. 3 is a cross-sectional structural schematic diagram of the internal-circulating heat dissipation system for a stage light of embodiment I of the present invention.

As shown in FIGS. 1 to 3, embodiment I of the present invention provides an internal-circulating heat dissipation system for a stage light, comprising a support arm 200, a light holder 100 and a circulating heat dissipation system, wherein the light holder 100 is pivotally connected to the support arm 200 through a pivot shaft 300, the pivot shaft 300 is of a shaft pipe structure, an internal space of the light holder 100 is in communication with an internal space of the support arm 200 through the pivot shaft 300, the circulating heat dissipation system comprises a cooling medium, a heat dissipation component located inside the support arm 200, and a power component that promotes the cooling medium to flow in circulation between the light holder 100 and the heat dissipation component through the shaft pipe structure, and the cooling medium is isolated from an external space of the stage light.

According to the internal-circulating heat dissipation system for a stage light, the cooling medium is driven by the power component to flow in circulation between the light holder 100 and the support arm 200 through the pivot shaft 300 of a shaft pipe structure, so that the heat inside the light holder 100 is brought out, and heat dissipation is performed by the heat dissipation component at the support arm 200, thereby enlarging the heat dissipation space and improving the heat dissipation efficiency while ensuring the leak tightness of the light holder 100. Moreover, since the heat dissipation component is arranged inside the support arm 200, the volume of the light holder 100 is effectively reduced as compared with the previous case in which the heat dissipation component is arranged inside the light holder 100, which facilitates the miniaturization of the stage light.

In general, when the cooling medium is gas, the cooling medium can directly flow through the pivot shaft 300, and when the cooling medium is a liquid, a pipe can be provided such that the cooling medium can flow through the pivot shaft 300 by means of the pipe.

In embodiment I of the present invention, the cooling medium is gas, and a rotary seal 320 is provided in a position where the light holder 100 is pivotally connected to the support arm 200. The rotary seal 320 may be a framework oil seal.

In a preferred embodiment of the present invention, the light holder 100 is pivotally connected to the support arm 200 through the two pivot shafts 300, both the pivot shafts 300 are of a shaft pipe structure, and the cooling medium flows into one of the shaft pipe structures and flows out of the other shaft pipe structure. As such, a circulation loop is formed, the heat dissipation channel is longer, and the cooling medium is cooled more thoroughly.

Figure 4:
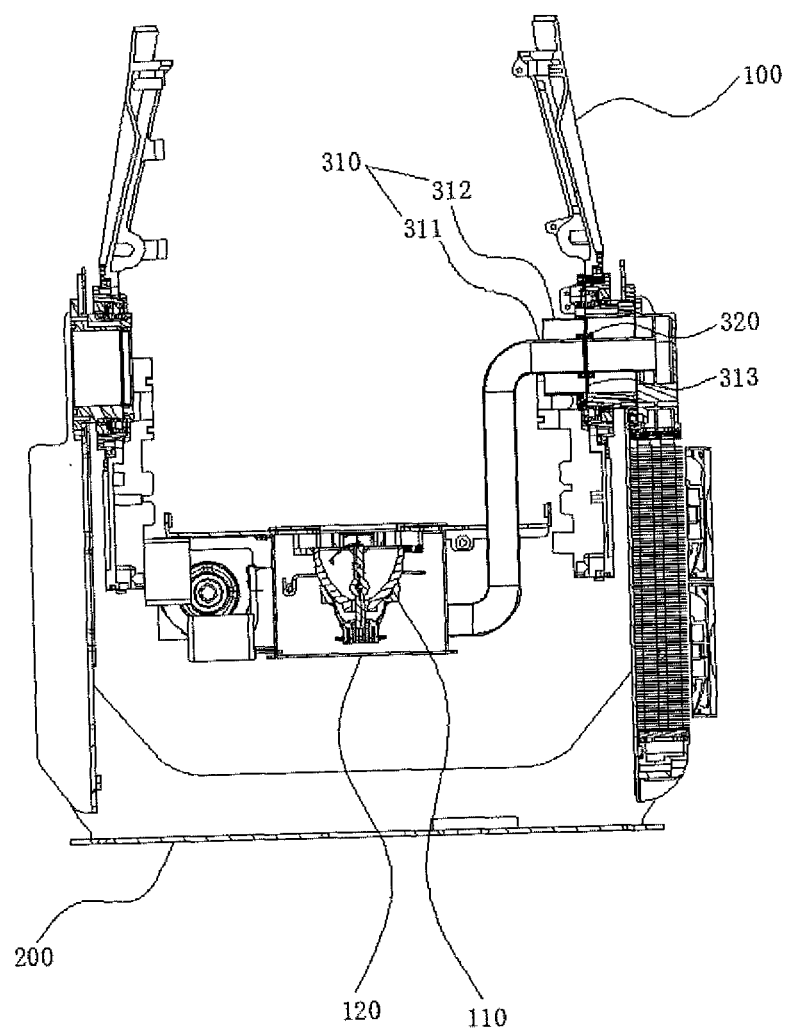
FIG. 4 is a front-side structural schematic diagram of an internal-circulating heat dissipation system for a stage light of embodiment II of the present invention.
Figure 5:
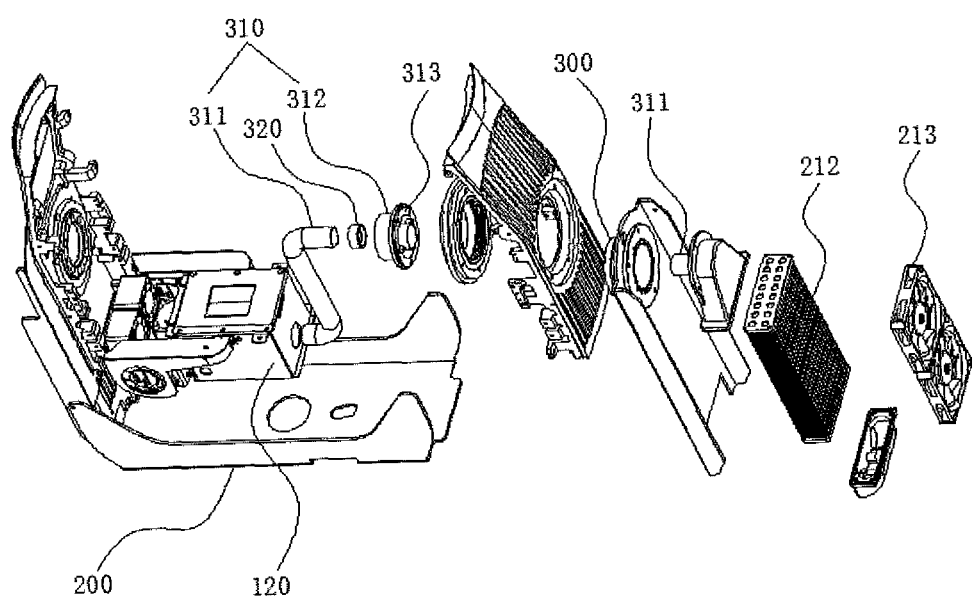
FIG. 5 is an exploded structural schematic diagram of the internal-circulating heat dissipation system for a stage light of embodiment II of the present invention.

As shown in FIGS. 4 to 5, in embodiment II of the present invention, the cooling medium flows into and out of the light holder 100 through the same pivot shaft 300. When the light holder 100 is pivotally connected to the support arm 200 only through one pivot shaft 300, such a method can be used; or else the light holder 100 is pivotally connected to the support arm 200 through two pivot shafts 300, the cooling medium flows into and out of the light holder 100 through the same pivot shaft 300, and one of the pivot shafts 300 can be reserved for a signal line or an electric wire passing therethrough, as shown in embodiment II of the present invention.

In a preferred embodiment of the present invention, a connecting pipe 310 is provided inside the pivot shaft 300, the connecting pipe 310 comprises an inner pipe 311 and an outer pipe 312, the cooling medium flows between the light holder 100 and the support arm 200 through the inner pipe 311 and an interlayer between the inner pipe 311 and the outer pipe 312, and a rotary seal 320 is provided on the inner pipe 311 and/or the outer pipe 312. One end of the flow guide pipe 212 of the heat dissipation component is connected to the inner pipe 311, and the other end of the flow guide pipe 212 is connected to the interlayer between the inner pipe 311 and the outer pipe 312, thereby realizing the cooling medium flowing into and out of the light holder 100 through the same pivot shaft 300.

In embodiment II of the present invention, the cooling medium is gas, the portion, located inside the light holder 100, of the outer pipe 312 is open so that the whole interior of the light holder 100 is filled up with the cooling medium, and a rotary seal 320 is provided on the inner pipe 311 so as to ensure that the cooling medium in the inner pipe 311 will not leak during rotation of the light holder 100. The rotary seal 320 can be a high-pressure rotary joint.

Optionally, a supporting member 313 is provided for supporting between the inner pipe 311 and the outer pipe 312.

In other embodiments, an end of the outer pipe 312 can be connected in a sealed manner with an outer side wall of the inner pipe 311, and in addition, the cooling medium in the interlayer between the inner pipe 311 and the outer pipe 312 is led out to a designated position by means of a guide pipe.

In a preferred embodiment of the present invention, the light holder 100 is pivotally connected to the support arm 200 through two pivot shafts 300, both the pivot shafts 300 are of a shaft pipe structure, and the cooling medium is divided into two flows, each of which flows in circulation between the light holder 100 and one of the heat dissipation components through one of the pivot shafts 300. The two flows of cooling medium are used for heat dissipation, which is higher in heat dissipation efficiency.

As shown in FIGS. 1 to 3, in a preferred embodiment of the present invention, the heat dissipation component comprises a heat dissipating fin 211, a flow guide pipe 212 passing through the heat dissipation fin 211 and used for guiding flow of the cooling medium, and a heat dissipation fan 213 for heat dissipation of the heat dissipation fin 211; and the support arm 200 is provided with a ventilation opening 220 corresponding to the heat dissipation fan 213. The cooling medium flows through the flow guide pipe 212 in which heat is trapped by the heat dissipating fin 211, then heat dissipation is performed for the flow guide pipe 212 and the heat dissipating fin 211 by the heat dissipation fan 213, and the heat is led out of the stage light through the ventilation opening 220, thereby realizing rapid heat dissipation for the stage light.

In a preferred embodiment of the present invention, the cooling medium is gas. When the gas flow between the light holder 100 and the support arm 200, the requirement of leak tightness is low, so that even if accidental leakage occurs, it will not cause any damage to the elements in the stage light.

In a preferred embodiment of the present invention, it further comprises a light source 110 and a heat insulation cavity 120 provided to enclose the light source 110, the heat insulation cavity 120 is in communication with a heat medium inlet of the heat dissipation component, and the power component further comprises at least one blowing mechanism 410, the blowing mechanism 410 blowing the cooling medium from a cooling medium outlet of the heat dissipation component into the heat insulation cavity 120 so as to perform heat dissipation for the light source 110. With the heat insulation cavity 120, all the heat is guided to the heat dissipation component, which can prevent the heat of the light source 110 from being dissipated into the light holder 100 to cause damage to other elements in the light holder 100. The heat insulation cavity 120 comprises a canister 121, and a heat insulation piece 122 covering the canister 121, with one end of the canister 121 being sealed by the heat insulation piece 122 so that the light from the light source 110 is emitted out through the heat insulation piece 122, and the other end of the canister 121 being in communication with the heat medium inlet of the heat dissipation component.

In a preferred embodiment of the present invention, it further comprises a flow dividing cavity 130, wherein the flow dividing cavity 130 has a first sealing chamber 131 and a second sealing chamber 132, the power component comprises at least one air extraction mechanism 420, a cooling medium outlet of the heat dissipation component is in communication with the first sealing chamber 131, the first sealing chamber 131 is further provided with an air extraction opening, the air extraction opening is provided with the air extraction mechanism 420, and the bottom of the heat insulation cavity 120 is in communication with the second sealing chamber 132 and is finally in communication with a hot gas flow inlet of the heat dissipation component through the second sealing chamber 132. With the flow dividing cavity 130, the low-temperature cooling medium is isolated from the high-temperature cooling medium, and the low-temperature cooling medium in the first sealing chamber 131 is drawn off by the air extraction mechanism 420 through the air extraction opening and fills up the whole interior of the light holder 100 as to perform heat dissipation for other elements inside the light holder 100, and is then blown into the heat insulation cavity 120 by the blowing mechanism 410 so as to perform heat dissipation for the light source 110, thereby realizing heat dissipation for the whole light holder 100.

In a preferred embodiment of the present invention, the light holder 100 is provided, on both sides, with a side plate 140 that is pivotally connected to the support arm 200; and a cold air channel, through which the cooling medium outlet is connected to the first sealing chamber 131, is at least partially formed by a cover plate 150 being fastened to the side plate 140, and/or a hot air channel, through which the heat medium inlet is connected to the second sealing chamber 132, is at least partially formed by a cover plate 150 being fastened to the side plate 140. By means of the cover plate 150 being directly fastened to the side plate 140 to form the cold air channel and/or the hot air channel, it only needs to use a cover plate 150 made of a panel, which is convenient for processing, and makes full use of the side plate of the support arm 200 without the need of mounting an additional air duct so as to avoid the problem of aging of the air duct.

In this embodiment, the cold air channel is in communication with the first sealing chamber 131, and the hot air channel is in communication with the second sealing chamber 132.

Obviously, the above embodiments of the present invention are merely embodiments used for clearly describing the present invention, instead of limiting the implementation modes of the present invention. For a person skilled in the art, other forms of changes or variations may also be made on the basis of the above illustration. There is no need and no way to exhaust all implementation modes here. Within the spirit and principle of the present invention, any modifications, equivalent replacements, improvements, etc., shall be comprised within the scope of protection of the present invention.

The invention claimed is:

1. An internal-circulating heat dissipation system for a stage light, the system comprising
   a support arm in U-shaped form;
   a light holder, which is pivotally connected to the support arm through a pivot shaft, the pivot shaft being in shaft pipe structure, an internal space of the light holder being in communication with an internal space of the support arm through the pivot shaft; and
   a circulating heat dissipation system, comprising
      a cooling medium that is gas being isolated from an external space of the stage light;
      a heat dissipation component being located inside the support arm;
      a power component being configured to promote the cooling medium to flow in circulation between the light holder and the support arm through the shaft pipe structure;
      a light source and a heat insulation cavity provided to enclose the light source, the heat insulation cavity is in communication with a heat medium inlet of the heat dissipation component, and the power component further comprises at least one blowing mechanism that blows the cooling medium from a cooling medium outlet of the heat dissipation component into the heat insulation cavity;
      a flow dividing cavity, wherein the flow dividing cavity has a first sealing chamber and a second sealing chamber, the power component comprises at least one air extraction mechanism, a cooling medium outlet of the heat dissipation component is in communication with the first sealing chamber, the first sealing chamber is further provided with an air extraction opening, the air extraction opening is provided with the air extraction mechanism, and the heat insulation cavity is in communication with a hot gas flow inlet of the heat dissipation component through the second sealing chamber; and
   wherein during the circulation, the cooling medium absorbs heat in the light holder, and the heated cooling medium is then cooled in the support arm by the heat dissipation component.

2. The internal-circulating heat dissipation system for a stage light according to claim 1, wherein the light holder is pivotally connected to the support arm through two opposite pivot shafts, both the pivot shafts are of a shaft pipe structure, and the cooling medium flows into one of the shaft pipe structures and flows out of the other shaft pipe structure.

3. The internal-circulating heat dissipation system for a stage light according to claim 1, wherein the cooling medium flows into and out of the light holder through the same pivot shaft.

4. The internal-circulating heat dissipation system for a stage light according to claim 3, wherein a connecting pipe is provided inside the pivot shaft, the connecting pipe comprises an inner pipe and an outer pipe, the cooling medium flows between the light holder and the support arm through the inner pipe and an interlayer between the inner pipe and the outer pipe, and a rotary seal is provided on the inner pipe and/or the outer pipe.

5. The internal-circulating heat dissipation system for a stage light according to claim 3, wherein two heat dissipation components are oppositely provided in the support form, the light holder is pivotally connected to the support arm through two pivot shafts, the two pivot shafts are arranged oppositely, both the pivot shafts are of a shaft pipe structure, and the cooling medium is divided into two circulating flows, each of which flows in circulation between the light holder and one of the heat dissipation components through one of the pivot shafts.

6. The internal-circulating heat dissipation system for a stage light according to claim 1, wherein the heat dissipation component comprises a heat dissipation fin, a flow guide pipe passing through the heat dissipation fin and used for guiding flow of the cooling medium, and a heat dissipation fan for heat dissipation of the heat dissipation fin; and the support arm is provided with a ventilation opening corresponding to the heat dissipation fan.

7. The internal-circulating heat dissipation system for a stage light according to claim 1, wherein the light holder is provided, on both sides, with a side plate that is pivotally connected to the support arm; and a cold air channel, through which the cooling medium outlet is connected to the first sealing chamber, is at least partially formed by a cover plate being fastened to the side plate, and/or a hot air channel, through which the heat medium inlet is connected to the second sealing chamber, is at least partially formed by a cover plate being fastened to the side plate.

* * * * *